(12) United States Patent
Inoue

(10) Patent No.: US 7,142,458 B2
(45) Date of Patent: Nov. 28, 2006

(54) NONVOLATILE SEMICONDUCTOR MEMORY DEVICE AND CONTROL METHOD THEREOF

(75) Inventor: Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 296 days.

(21) Appl. No.: 10/929,920

(22) Filed: Aug. 31, 2004

(65) Prior Publication Data

US 2005/0088897 A1  Apr. 28, 2005

(30) Foreign Application Priority Data

Sep. 9, 2003  (JP) .............................. 2003-317292

(51) Int. Cl.
*G11C 16/04* (2006.01)
(52) U.S. Cl. ..................... 365/185.28; 365/185.23; 365/185.29
(58) Field of Classification Search ........... 365/185.28, 365/185.23, 185.29
See application file for complete search history.

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,940,325 A * | 8/1999 | Chang et al. | 365/185.28 |
| 5,969,383 A | 10/1999 | Chang et al. | |
| 6,044,022 A | 3/2000 | Nachumovsky | |
| 6,081,456 A | 6/2000 | Dadashev | |
| 6,177,318 B1 | 1/2001 | Ogura et al. | |
| 6,191,445 B1 | 2/2001 | Fujiwara | |
| 6,248,633 B1 | 6/2001 | Ogura et al. | |
| 6,255,166 B1 | 7/2001 | Ogura et al. | |
| 6,331,952 B1 | 12/2001 | Wang et al. | |
| 6,587,380 B1 | 7/2003 | Kanai et al. | |
| 6,587,381 B1 | 7/2003 | Kanai et al. | |
| 6,704,224 B1 | 3/2004 | Natori | |

FOREIGN PATENT DOCUMENTS

| | | |
|---|---|---|
| JP | 7-161851 | 6/1995 |
| JP | B1 2978477 | 9/1999 |

(Continued)

OTHER PUBLICATIONS

U.S. Appl. No. 10/915,363, filed Aug. 11, 2004, Inoue.

(Continued)

*Primary Examiner*—David Lam
(74) *Attorney, Agent, or Firm*—Oliff & Berridge, PLC

(57) ABSTRACT

To provide a nonvolatile semiconductor memory device in which a disturb voltage onto a non-selected memory cell in writing operation is lessened, a nonvolatile semiconductor memory device, includes: a memory cell array equipped with a plurality of memory cells, a plurality of word lines, a plurality of bit lines, and a plurality of source lines; a word line control circuit to control the plurality of word lines; and a line control circuit to control the plurality of bit lines and the plurality of source lines. Each of the plurality of memory cells is equipped with a gate electrode, a first impurity region, a second impurity region, and an electron trap region, which is positioned between the gate electrode and a substrate, and is formed at least at the first impurity region side of both the first impurity region and second impurity region. At the time when a writing operation is performed for a selected memory cell, the word line control circuit provides a selected word line connected to the selected memory cell with a selection voltage, provides a non-selected word line with a first mis-erasing prevention voltage, and provides a source line that is not connected to the selected memory cell with a second mis-erasing prevention voltage.

18 Claims, 9 Drawing Sheets

FOREIGN PATENT DOCUMENTS

JP    A 2001-156188    6/2001

OTHER PUBLICATIONS

Hayashi et al. "Twin Monos Cell With Dual Control Gates," 2000 Symposium on VLSI Technology Digest of Technical Papers, 2000 IEEE.

Chang et al. "A New Sonos Memory Using Source-Side Injection for Programming," IEEE Electron Device Letters, vol. 19, No. 7, Jul. 1998.

Chen et al. "A Novel Flash Memory Device With Split Gate Source Side Injection and Ono Charge Storage Stack (SPIN)," 1997 Symposium on VLSI Technology Digest of Technical Papers, 1997.

* cited by examiner

|  |  | MEMORY CELL m1-1 | MEMORY CELL m1-2 |
|---|---|---|---|
| WRITE | WORD LINE | SELECTED WORD LINE (WL1) 11V | NON-SELECTED WORD LINE (WL2) 2.5V |
| WRITE | BIT LINE | BL1 5.5V | BL1 5.5V |
| WRITE | SOURCE LINE | SL1 0V | SL2 1.8V |
| ERASE | WORD LINE | WL1 0V | WL2 0V |
| ERASE | BIT LINE | BL1 8V | BL1 8V |
| ERASE | SOURCE LINE | SL1 0V | SL2 0V |
| READ | WORD LINE | SELECTED WORD LINE (WL1) 3V | NON-SELECTED WORD LINE (WL2) 0V |
| READ | BIT LINE | BL1 2V | BL1 2V |
| READ | SOURCE LINE | SL1 0V | SL2 0V |

NONVOLATILE SEMICONDUCTOR MEMORY DEVICE AND CONTROL METHOD THEREOF

The present application claims priority to Japanese Patent Application No. 2003-317292 filed Sep. 9, 2003 which is hereby expressly incorporated by reference herein in its entirety.

BACKGROUND OF THE INVENTION

1. Field of Invention

Exemplary aspects of the present invention relate to a nonvolatile semiconductor memory device, and a control method thereof.

2. Description of Related Art

As industrial development progresses, various types of nonvolatile semiconductor memory devices are being developed. One such related art device is a MONOS (Metal-Oxide-Nitride-Oxide-Semiconductor on substrate) type nonvolatile semiconductor memory device. See U.S. Pat. Nos. 6,044,022 and 6,081,456. In such a memory device, an electron trap region is formed between a gate electrode and a substrate in a memory chip. The amount of electrons in the trap region is controlled by electric-field control. Since the amount of electrons in the trap region is stored for a long time, the memory chip can be used as a nonvolatile memory.

SUMMARY OF THE INVENTION

However, memory devices of this kind have a possible problem that mis-writing and mis-erasing may be caused to a non-selected memory chip due to an influence of a disturb voltage. To address and/or solve this and/or other problem, a related art memory device needs to sacrifice an integration level and/or access speed of its memory chip.

Exemplary aspects of the present invention lessen the influence of such a disturb voltage on a memory chip.

Exemplary aspects of the present invention relate to a nonvolatile semiconductor memory device, including: a memory cell array equipped with a plurality of memory cells arranged in a matrix, a plurality of word lines, a plurality of bit lines, and a plurality of source lines; a word line control circuit to control the plurality of word lines; and a line control circuit to control the plurality of bit lines and the plurality of source lines. Each of the plurality of memory cells is equipped with a gate electrode connected to a word line, a first impurity region connected to a bit line, a second impurity region connected to a source line, and an electron trap region, which is positioned between the gate electrode and a substrate, and is formed at least at the first impurity region side of both the first impurity region and second impurity region. At the time when a writing operation is done for a selected memory cell, the word line control circuit provides a selected word line connected to the selected memory cell with a selection voltage. The word line control circuit provides a non-selected word line connected to a non-selected memory cell that is connected in common to a bit line connected to the selected memory cell with a first mis-erasing prevention voltage. At the time when a writing operation is done for a selected memory cell, the line control circuit provides a bit line connected to the selected memory cell with a program voltage, the line control circuit provides a source line connected to the selected memorial cell with a source voltage for a program, the line control circuit provides a bit line connected to the non-selected memory cell that is connected in common to a bit line connected to the selected memory cell with a program voltage, and the line control circuit provides a source line connected to the non-selected memory cell with a second mis-erasing prevention voltage. The above measures make it possible to lessen an influence of a disturb voltage at the time of writing.

Furthermore, the word line control circuit, to which exemplary aspects of the present invention relates, can also provide a positive voltage lower than the selection voltage as the first mis-erasing prevention voltage. The above measures make it possible to prevent mis-writing from occurring in a non-selected memory cell at the time of writing.

Still further, the line control circuit, to which an exemplary aspect of the present invention relates, can also provide a positive voltage lower than the selection voltage as the second mis-erasing prevention voltage. The above measures make it possible to reduce or prevent mis-writing from occurring in a non-selected memory cell even though a first mis-erasing prevention voltage is set with a high voltage.

Moreover, the word line control circuit, to which an exemplary aspect of the present invention relates, can also provide a voltage lower than a gate threshold voltage of a memory cell, for which a writing operation is done, as the first mis-erasing prevention voltage. The above measures make it possible to lessen an influence of a disturb voltage at the time of writing with almost no increase of the amount of electrons trapped in a non-selected memory cell.

Furthermore, the word line control circuit, to which an exemplary aspect of the present invention relates, can also provide a voltage lower than a gate threshold voltage of a memory cell, for which erasing operation is done, as the first mis-erasing prevention voltage. The above measures make it possible to prevent mis-erasing from occurring in a non-selected memory cell at the time of writing.

Still further, the trap region, to which an exemplary aspect of the present invention relates, may also be formed at a nitride film placed between a first oxide film and a second oxide film.

Moreover, the trap region, to which an exemplary aspect of the present invention relates, may also be formed at a silicon dot region placed between a first oxide film and a second oxide film.

Furthermore, the word line control circuit, to which an exemplary aspect of the present invention relates, can also provide a word line connected to the selected memory cell with an erasing voltage lower than the mis-erasing prevention voltage, at the time when an erasing operation is done for the selected memory cell.

Then, in the nonvolatile semiconductor memory device, to which an exemplary aspect of the present invention relates; the plurality of word lines and the plurality of source lines may be arranged along a row direction. Furthermore, the plurality of bit lines may be arranged along a column direction. Moreover, the second impurity region of each memory cell of at least one row arranged in a row direction, may be connected to at least one source line in common. Furthermore, the gate electrode of each memory cell of at least one row arranged in the row direction, may be connected to at least one word line in common. Still further, the first impurity region of each memory cell of at least one column arranged in a column direction may be connected to at least one bit line in common.

Furthermore, the trap region, to which an exemplary aspect of the present invention relates, may be formed at the first impurity region side, while being positioned between the gate electrode and a substrate.

Moreover, in the nonvolatile semiconductor memory device, to which an exemplary aspect of the present invention relates; the second impurity region of the memory cell of one row arranged in the row direction, and a second impurity region of a memory cell of another row that is arranged in the row direction, while being adjacent to the memory cell of one row, may be connected to at least one of the source lines in common.

Furthermore, the trap region, to which an exemplary aspect of the present invention relates, may be formed at the second impurity region side positioned between the gate electrode and a substrate Still further, an exemplary aspect of the present invention relates to a method of controlling a nonvolatile semiconductor memory device that includes a memory cell array equipped with a plurality of memory cells arranged in a matrix, a plurality of word lines, a plurality of bit lines, and a plurality of source lines, including: each of the plurality of memory cells is equipped with a gate electrode connected to a word line, a first impurity region connected to a bit line, a second impurity region connected to a source line, and an electron trap region, which is positioned between the gate electrode and a substrate, and is formed at least at the first impurity region side of both the first impurity region and second impurity region. At the time of a writing operation for a selected memory cell, providing the gate electrode of the selected memory cell with a selection voltage, providing the gate electrode of a non-selected memory cell connected in common to a selected bit line connected to the selected memory cell with a first mis-erasing prevention voltage, providing the first impurity region of the selected memory cell with a program voltage, providing the second impurity region of the selected memory cell with a source voltage for a program, providing the first impurity region of the non-selected memory cell connected to the selected bit line in common with a program voltage, and providing the second impurity region of the non-selected memory cell with a second mis-erasing prevention voltage.

Furthermore, in the control method, to which an exemplary aspect of the present invention relates; a positive voltage lower than a selection voltage can also be provided as the first mis-erasing prevention voltage.

Still further, in the control method, to which an exemplary aspect of the present invention relates; a positive voltage lower than a selection voltage can also be provided as the second mis-erasing prevention voltage.

Moreover, in the control method, to which an exemplary aspect of the present invention relates; a voltage lower than a gate threshold voltage of a memory cell, for which a writing operation is done, can also be provided as the first mis-erasing prevention voltage.

Furthermore, in the control method, to which an exemplary aspect of the present invention relates; a voltage lower than a gate threshold voltage of a memory cell, for which an erasing operation is done, can also be provided as the first mis-erasing prevention voltage.

Still further, in the control method, to which an exemplary aspect of the present invention relates; at the time when an erasing operation is done for the selected memory cell, an erasing voltage can also be provided for the gate electrode of the selected memory cell.

DETAILED DESCRIPTION OF EXEMPLARY EMBODIMENTS

Figure 1:
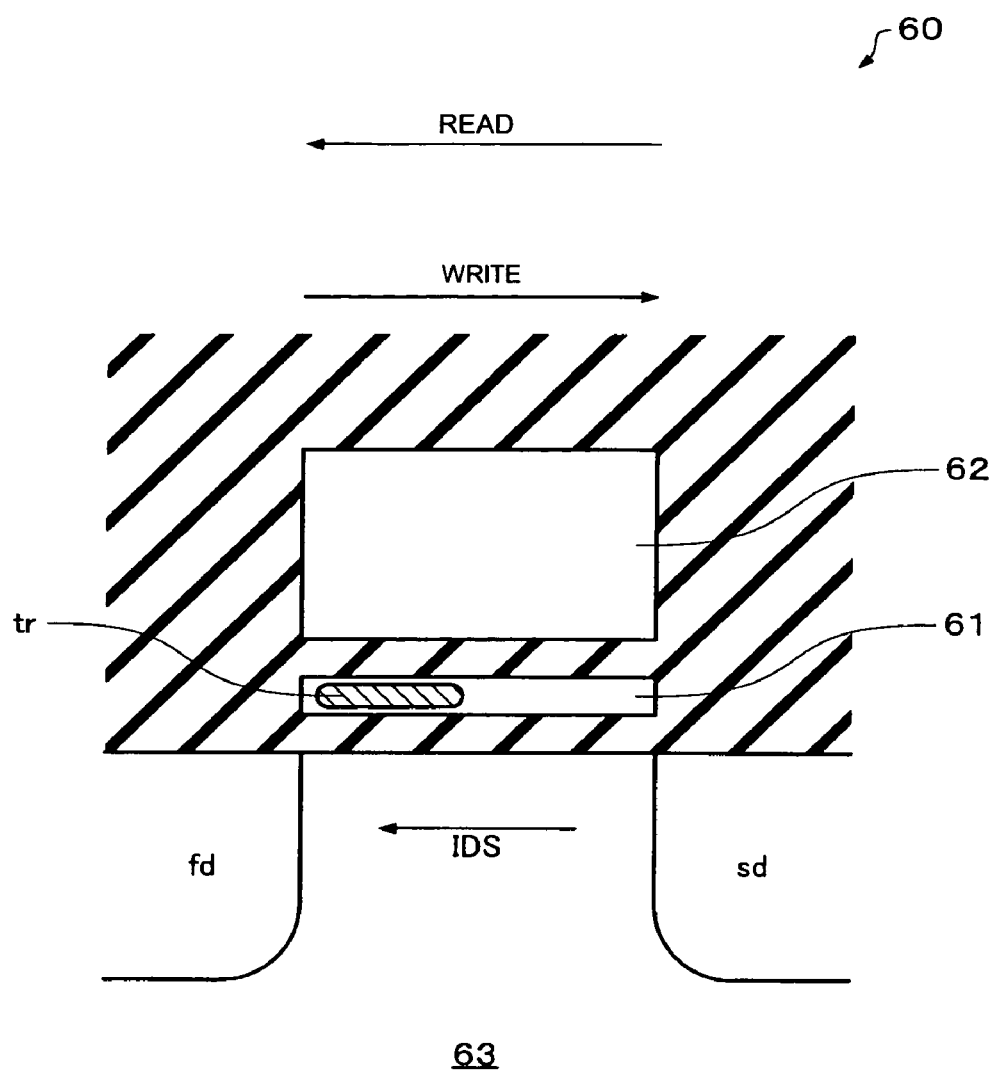
FIG. 1 is a schematic of a memory cell.

The following sections explain an exemplary embodiment of the present invention while referring to the drawings. Incidentally, the exemplary embodiment explained below does not confine the contents of the present invention. Furthermore, all the structures explained below are not necessarily the indispensable constituent features of the present invention.

1. General Operation

General operation is explained by referring to FIG. 1. FIG. 1 is a schematic of a memory cell, and the memory cell is indicated with a reference numeral 60. Reference numeral 61 represents a nitride film (it is a dielectric film in a broad sense). A symbol tr refers to a trap region. Reference numeral 62 represents a gate electrode. A symbol fd refers to a first impurity region. A symbol sd refers to a second impurity region. Reference numeral 63 represents a substrate. A symbol IDS indicates a current flowing in a channel region between the first impurity region fd and the second impurity region sd. In the figures described below, any component having the same reference numeral or symbol represents the same component.

When a writing operation (writing data in a broad sense) is done for the memory cell 60, a writing voltage (for example, 5.5V) is applied onto the first impurity region fd. The second impurity region sd is set with a grounding potential or into a floating condition. The gate electrode 62 is supplied with a selection voltage (for example, 11V). Under such voltage applying condition, a channel is formed in a region between the first impurity region fd and the second impurity region sd. An electron around the first impurity region fd becomes a hot electron due to the writing voltage applied onto the first impurity region fd. The hot electron gets affected by the gate electrode 62, to which the selection voltage is applied, so as to implement tunneling through an oxide barrier and gets trapped into the nitride film 61. The nitride film 61 of the memory cell 60, for which a writing operation has been performed, is in a condition of trapping the electron.

When an erasing operation (writing data in a broad sense) is done for the memory cell 60, an erasing voltage (for example, 8V) is applied onto the first impurity region fd. The second impurity region sd is set with a grounding potential or into a floating condition. The gate electrode 62 is supplied with an erasing selection voltage (for example, 0V). Under such a voltage applying condition, a channel is formed between the first impurity region fd and the second impurity region sd in the substrate 63. A hot hole is generated around the first impurity region fd due to the erasing voltage applied onto the first impurity region fd. If any electron is trapped in the nitride film 61, the hot hole combines with the electron. The nitride film 61 of the memory cell 60, for which erasing operation has been done, is in a condition of trapping almost no electrons.

When a reading operation (reading data in a broad sense) is done for the memory cell 60, the first impurity region fd is set with a grounding potential or into a floating condition. A reading voltage (for example, 2V) is applied onto the second impurity region sd. The gate electrode 62 is supplied with a reading selection voltage (for example, 3V). Under such voltage applying condition, the current IDS flowing in the channel region between the first impurity region fd and the second impurity region sd varies according to the amount of electrons trapped in the nitride film 61. By detecting the change of the current IDS with a read amplifier, etc., it becomes possible to carry out a reading operation for the memory cell 60. If the amount of electron trapped in the nitride film 61 is large enough so as to increase the gate threshold voltage of the memory cell 60 so that the gate threshold voltage is higher than the reading selection voltage at the time of reading operation, the current IDS hardly flows.

The three operations (writing, erasing, and reading) in general operation are as described above.

2. Entire Structure

Figure 2:
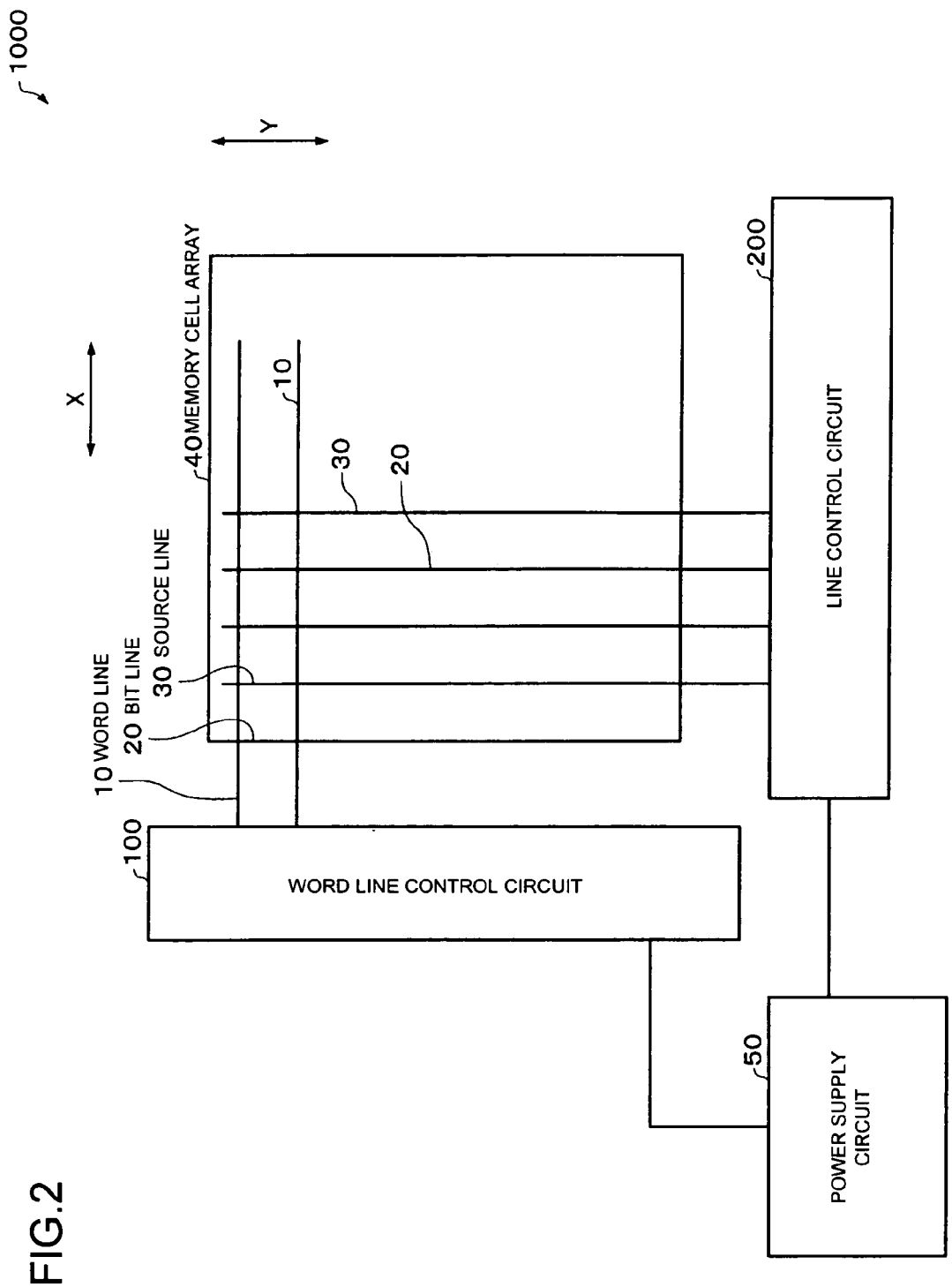
FIG. 2 is a schematic of a nonvolatile semiconductor memory device of an exemplary embodiment.

FIG. 2 illustrates a structure of a nonvolatile semiconductor memory device 1000. The nonvolatile semiconductor memory device 1000 includes a word line control circuit 100, a line control circuit 200, and a power supply circuit 50. A plurality of word lines 10, being arranged along a row direction X, are connected to the word line control circuit 100. A plurality of bit lines 20 and a plurality of source lines 30, being arranged along a column direction Y, are connected to the line control circuit 200. A reference numeral 40 represents a memory cell array, and the memory cell array 40 includes a plurality of memory cells 60, which are arranged in a matrix and each of which is illustrated in FIG. 1.

Figure 3:
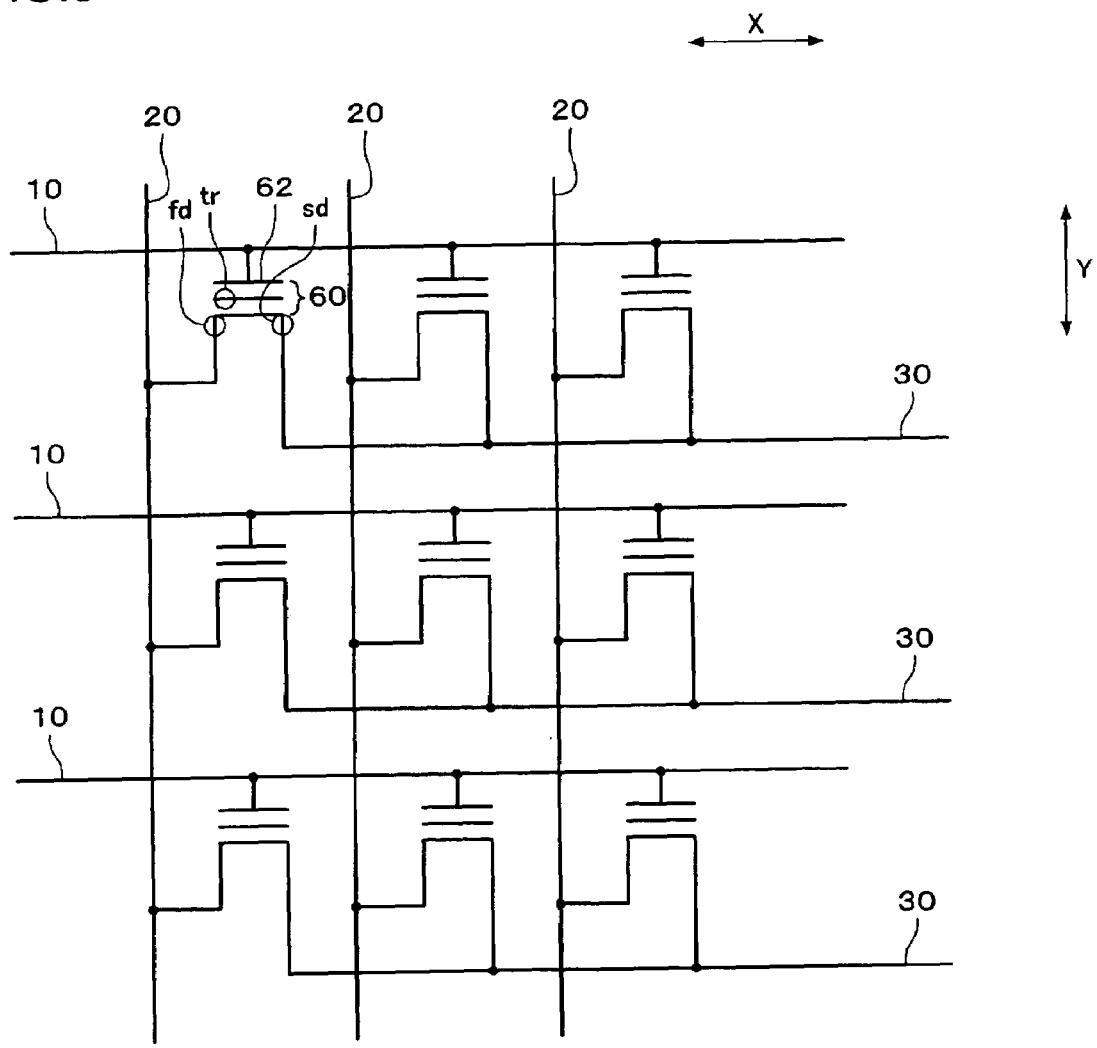
FIG. 3 is a schematic to show connecting conditions of a memory cell.

FIG. 3 shows a part of the memory cell array 40. The gate electrode 62 of each of the plurality of memory cells 60, which are arranged along the row direction X, is connected to a word line 10 in common. The first impurity region fd of each of the plurality of memory cells 60, which are arranged along the column direction Y, is connected to a bit line 20 in common. Furthermore, the second impurity region sd of each of the plurality of memory cells 60, which are arranged along the column direction Y, is connected to a source line 30 in common.

3. Explanation of Operation

Figure 4:
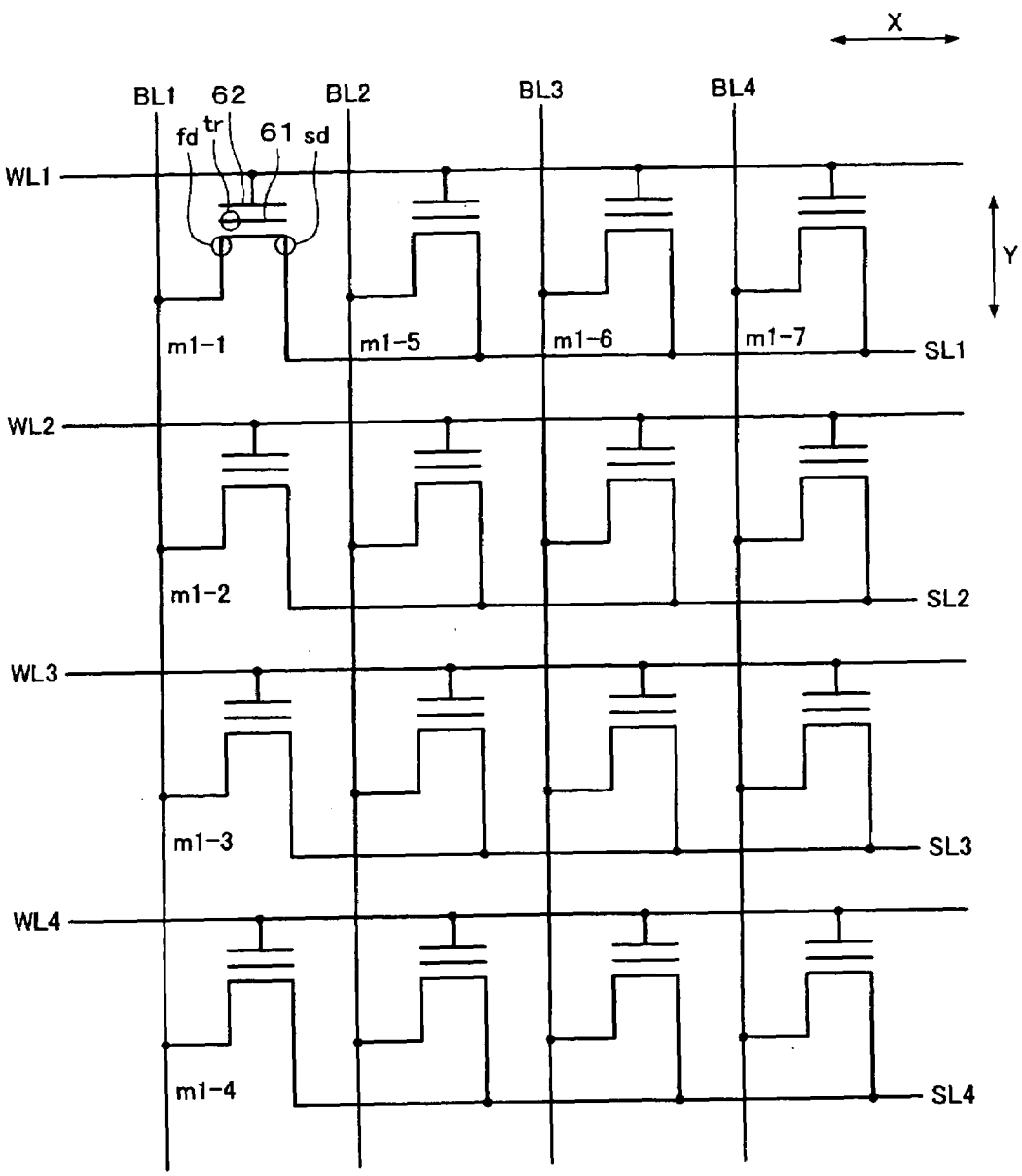
FIG. 4 is a schematic to show a block of a memory cell array of the exemplary embodiment.

By referring to FIG. 4, an operation in this exemplary embodiment is described below. FIG. 4 illustrates a block of the memory cell array 40. Each of reference numerals WL1 through WL4 represents the word line 10, and each of reference numerals BL1 through BL4 represents the bit line 20. Each of reference numerals SL1 through SL4 represents the source line 30, and each of reference numerals m1-1 through m1-7 represents the memory cell 60.

Figures 5, 6:
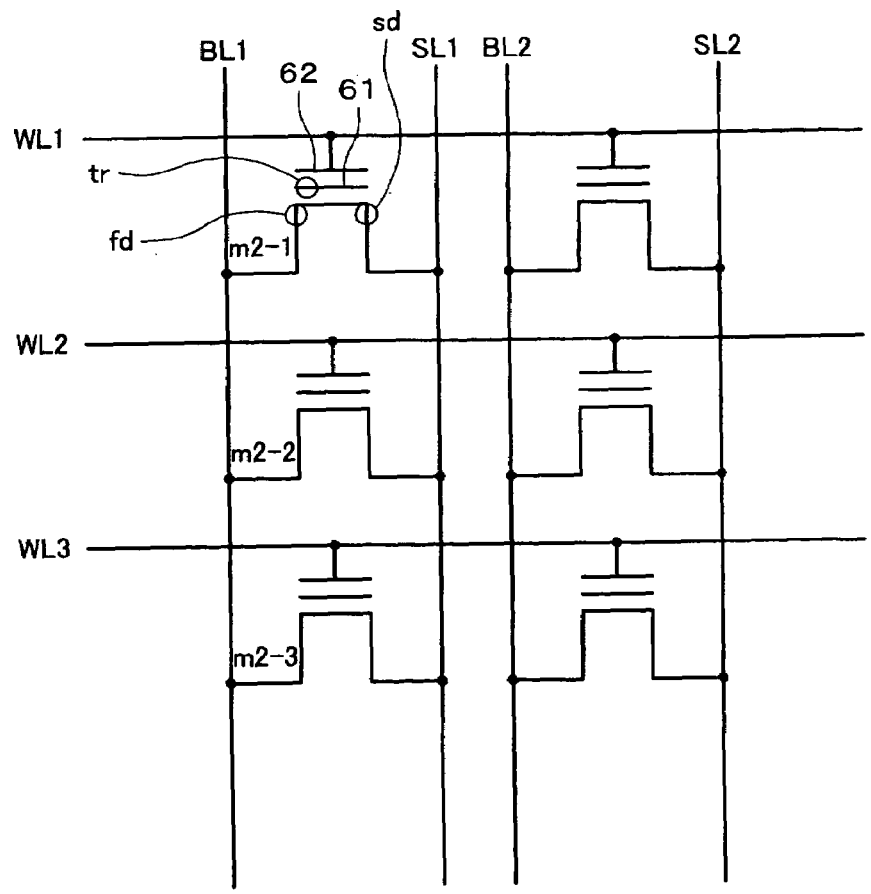
FIG. 5 is a schematic to show values of voltage to be applied onto a memory cell of the exemplary embodiment.
FIG. 6 is a schematic to show a part of a memory cell array of an example of a related art device.

Each of the word lines, WL1 through WL4, and the source lines, SL1 through SL4 is arranged along the row direction X. Each of the bit lines BL1 through BL4 is arranged along the column direction Y. The second impurity region sd of each of the memory cells 60 (for example; memory cells of m1-1, m1-5, m1-6, and m1-7), which are arranged along the row direction X, is connected to one source line 30 in common. The gate electrode 62 of each of the memory cells 60 (for example; memory cells of m1-1, m1-5, m1-6, and m1-7), which are arranged along the row direction X, is connected to the word line WL1 in common. The first impurity region fd of each of the memory cells 60 (for example; memory cells of m1-1 through m1-4), which are arranged along the column direction Y, is connected to the bit line BL1 in common. Between the gate electrode 62 and the substrate 63, the trap region tr is formed at the side of the first impurity region fd. FIG. 5 shows each voltage to be applied to the word lines, the bit lines, and the source lines in each operation (writing, erasing, and reading).

3.1 Writing into the Memory Cell m1-1

The word line control circuit 100 supplies the word line WL1 with a selection voltage (for example, 11V in FIG. 5) to select the memory cell m1-1. The other word lines, WL2 through WL4, in the block are each supplied with a first mis-erasing prevention voltage (for example, 2.5V in FIG. 5). The line control circuit 200 supplies the bit line BL1 connected to the memory cell m1-1 with a writing selection voltage (for example, 5.5V in FIG. 5). Furthermore, the line control circuit 200 supplies the source line SL1, connected to the memory cell m1-1, with a writing source voltage (for example, 0V in FIG. 5), and supplies the other source lines SL2 through SL4 each with a second mis-erasing prevention voltage (for example, 1.8V in FIG. 5). Still further, the line control circuit 200 sets each of the bit lines, BL2 through BL4, in the block with a grounding potential. As another treatment method, each of the bit lines BL2 through BL4 may be set into a floating condition as well.

Under such voltage applying conditions, a channel is formed between the first impurity region fd and the second impurity region sd in the memory cell m1-1. Since the gate electrode 62 of the memory cell m1-1 is supplied with a selection voltage by the word line WL1, the electron inside the channel region implements tunneling through an oxide barrier between the nitride film 61 and the substrate 63 to get trapped into the nitride film 61. Specifically, the electron is written into the memory cell m1-1 by a writing operation, and data is written into the memory cell.

Each of the memory cells, m1-2 through m1-4, (hereinafter, non-selected memory cells) is connected to the bit line BL1 as the memory cell m1-1 is. Therefore, the first impurity region fd of each of the memory cells, m1-2 through m1-4, is supplied with a writing selection voltage. However, each of the word lines, WL2 through WL4, which are connected to the memory cells, m1-2 through m1-4, respectively, is supplied with the first mis-erasing prevention voltage that is lower than the selection voltage. Each of the source lines, SL2 through SL4, is supplied with the second mis-erasing prevention voltage. As a result, almost no electron tunneling is caused in each of the memory cells m1-2 through m1-4. Specifically, no electron is written into the non-selected memory cells. Mis-erasing onto the non-selected memory cells can be prevented by the first mis-erasing prevention voltage and the second mis-erasing prevention voltage. This effect and so on are described later.

Then, since each of the memory cells, m1-5 through m1-7, is connected to the word line WL1 and the source line SL1 as the memory cell m1-1 is, the gate electrode 62 of each of the memory cells, m1-5 through m1-7, is supplied with a selection voltage, and the second impurity region sd of each of the memory cells, m1-5 through m1-7, is supplied with a writing source voltage. However, since each of the bit lines, BL2 through BL4, which are connected to the memory cells, m1-5 through m1-7, respectively, is set with a grounding potential (or into a floating condition if another treatment method is applied), no hot electron is caused so that almost no electron tunneling is caused in each of the memory cells, m1-5 through m1-7. Specifically, no electron is written into the memory cells m1-5 through m1-7.

Moreover, no data is written into any other memory cell 60 either (specifically, any memory cell 60 that is connected neither to the word line WL1 nor to the bit line BL1. Hereinafter, such a memory cell may also be called a complete non-selected memory cell). The gate electrode 62 of any complete non-selected memory cell is supplied with the first mis-erasing prevention voltage by each of the word lines WL2 through WL4. The second impurity region sd of any complete non-selected memory cell is supplied with the second mis-erasing prevention voltage by each of the source lines SL2 through SL4. Furthermore, since the first impurity region fd a complete non-selected memory cell is set with a grounding potential (or into a floating condition if another treatment method is applied), no electron tunneling is caused in the complete non-selected memory cell.

3.2 Erasing

Next, an erasing operation is described. In this exemplary embodiment, an operation of removing the electron out of the nitride film 61 in the memory cell 60 is called an erasing operation. The word lines, WL1 through WL4, are supplied with an erasing selection voltage (for example, 0V in FIG. 5). The bit lines, BL1 through BL4, are supplied with an erasing voltage (for example, 8V in FIG. 5). Though the source lines, SL1 through SL4, are set into a floating condition, they may be set with a grounding potential as well.

Under such voltage applying conditions, an erasing operation is done for all the memory cells 60 in the block. Since the first impurity region fd of each memory cell 60 is supplied with an erasing voltage, a hot hole is generated around the first impurity region fd. The gate electrode 62 of each memory cell 60 is supplied with an erasing selection voltage. For a memory cell where an electron has been written in, the hot hole is injected into the nitride film 61 in the memory cell 60 under the effect of the erasing selection voltage. Thus, the hot hole becomes neutralized with the electron in the nitride film 61 so that the memory cell 60 gets into a condition under which almost no electron is trapped in the memory cell 60. Specifically, the condition means that erasing operation (i.e., writing data in a broad sense) has been done.

As a sample case of erasing operation, erasing in this exemplary embodiment is carried out for an entire block collectively. Specifically, erasing is done for all the memory cells 60 of the block collectively. However, it may also be possible to carry out erasing only for a single memory cell 60.

3.3 Reading the Memory Cell m1-1

Next, a reading operation is described. The word line WL1 connected to the gate electrode 62 of the memory cell m1-1 (selected memory cell) is supplied with a reading selection voltage (for example, 3V in FIG. 5). Each of the other word lines, WL2 through WL4, is supplied with a non-selection voltage (for example, 0V in FIG. 5). Each of the source lines, SL1 through SL4, is set with a grounding potential. As another treatment method, each of the source lines, SL1 through SL4, may be set into a floating condition as well. Then the bit line BL1, connected to the selected memory cell, is supplied with a reading voltage (for example, 2V in FIG. 5). The other bit lines, BL2 through BL4, are set with a grounding potential. As another treatment method, the bit lines, BL2 through BL4, may be set into floating condition as well.

Under such voltage applying condition, a reading operation is done by detecting the current IDS between the bit line BL1 and the source line SL1, connected to the selected memory cell. If no electron is trapped in the nitride film 61 of the selected memory cell, a channel is formed by the reading selection voltage between the first impurity region fd and the second impurity region sd in the selected memory cell so that the current IDS flows there. If any electron is trapped in the nitride film 61 of the selected memory cell, the gate threshold voltage of the selected memory cell gets increased. Since the reading selection voltage is set to be lower than the gate threshold voltage, the current IDS flowing between the first impurity region fd and the second impurity region sd in the selected memory cell becomes very little. The current IDS, which changes according to the amount of the electron in the nitride film 61, is then amplified with a read amplifier for data judgment.

Each of the memory cells m1-2 through m1-4 (they may also be called non-selected memory cells) is connected to the bit line BL1 as the memory cell m1-1 is. Therefore, the first impurity region fd of each of the memory cells, m1-2 through m1-4, is supplied with a reading voltage. However, each of the word lines, WL2 through WL4, that are connected to the memory cells m1-2 through m1-4, respectively, is supplied with a non-selection voltage (for example, 0V. Therefore, almost no current IDS flows in each of the memory cells m1-2 through m1-4. For the same reason, no electron tunneling is caused there.

Then, since each of the memory cells, m1-5 through m1-7, is connected to the word line WL1 as the memory cell m1-1 is, the gate electrode 62 of each of the memory cells, m1-5 through m1-7, is supplied with a reading selection voltage. However, since each of the bit lines, BL2 through BL4, which are connected to the memory cells, m1-5 through m1-7, respectively, and the source line SL-1 are set with a grounding potential (or into a floating condition if another treatment method is applied), almost no current IDS flows in each of the memory cells m1-5 through m1-7. Due to the same reason, almost no electron tunneling is caused there.

The gate electrode 62 of any other memory cell 60 (it may also be called a complete non-selected memory cell) is supplied with a non-selection voltage by each of the word lines WL2 through WL4. Moreover, the first impurity region fd and the second impurity region sd of the complete non-selected memory cell are set with a grounding potential (or into a floating condition if another treatment method is applied. Therefore, almost no current IDS flows in the complete non-selected memory cell.

4. Comparison with an Example of a Related Art Device and Effect

An example of a related art device is described below at first by referring to FIG. 6, which shows a part of a memory cell array. Each of reference numerals m2-1 through m2-3 represents a memory cell. The word lines WL1 through WL3 are each connected to the gate electrode 62 of each of the memory cells m2-1 through m2-3. The bit line BL1 and the source line SL1 are connected to the first impurity region fd and the second impurity region sd, respectively, of each of the memory cells m2-1 through m2-3.

When a reading operation is implemented onto the memory cell m2-1, the word line WL1 is supplied with a voltage of 11V, while the bit line BL1 is supplied with a voltage of 5.5V. Any other lines, such as the word lines WL2 and WL3, the bit line BL2, and the source lines, SL1 and SL2, are supplied with a voltage of 0V. At that time, an electron is written into the memory cell m2-1 through the general operation described above. However, this example of a related art device has some problems described below.

Under such voltage applying conditions, the voltage of 5.5V of the bit line BL1 functions as a disturb voltage for each of the memory cells m2-2 and m2-3. Then, a hot hole is caused by the bit line BL1 around the first impurity region fd of each of the memory cells m2-2 and m2-3. If any of the memory cells, m2-2 and m2-3, has an electron trapped, the hot hole caused at the side of the first impurity region fd gets injected into the nitride film 61. As a result, the injected hot hole combines with the trapped electron to reduce the amount of the electron trapped in the nitride film 61. There is a chance that, at the worst, the same result as an erasing operation for the memory cell may be caused.

Figure 7:
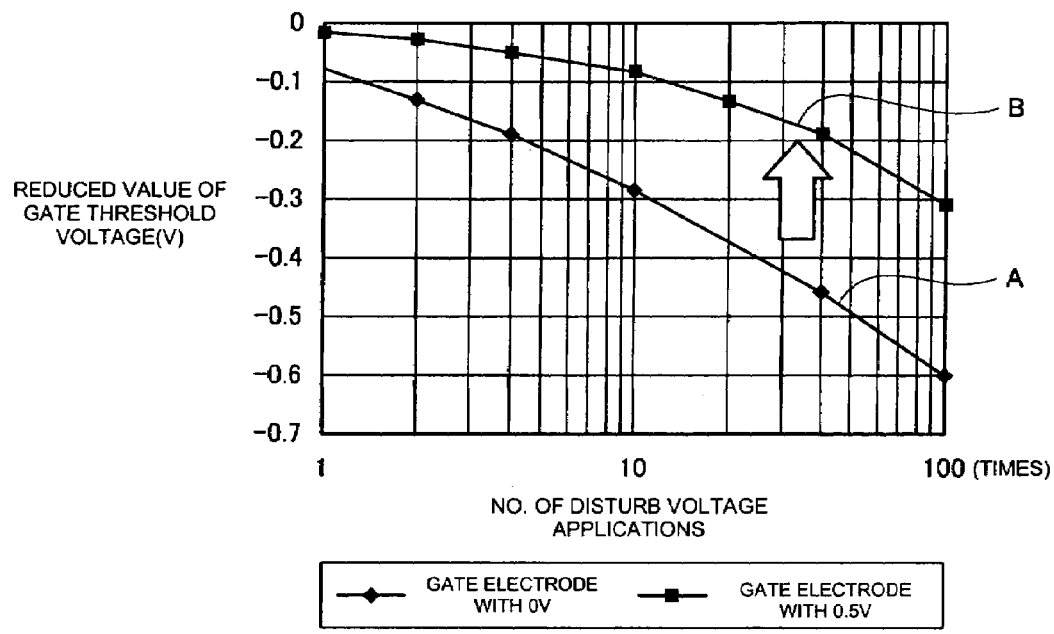
FIG. 7 is a graph to show decrease of a gate threshold voltage due to a disturb voltage.

FIG. 7 illustrates a graph showing a relationship between the no. of disturb voltage applications vs. the gate threshold voltage value. The graph is based on an actual measured data. The actual measured data of the graph is obtained by measuring the reduced value of the gate threshold voltage of the memory cell while repeating application of a disturb voltage under a condition where the disturb voltage (5V) is applied for 100μ-seconds at a time onto the first impurity region fd of the memory cell, for which a writing operation is done. The vertical axis indicates the reduced value of the gate threshold voltage. The horizontal axis represents the number of the disturb voltage applications. The actual measured data shown in the graph is obtained under a condition where the second impurity region sd is set with a grounding potential.

The line A, in FIG. 7, is a curve showing the reduced value of the gate threshold voltage of the memory cell under a condition where a voltage of 0V is applied onto the gate electrode 62 of the memory cell. The line A can be regarded as a curve showing the reduced value of the gate threshold voltage of the memory cells m2-2 and m2-3 of FIG. 6 while writing operation of the example of a related art is repeatedly done for the memory cell m2-1 of FIG. 6.

The line B in FIG. 7 is a curve showing the reduced value of the gate threshold voltage of the memory cell under a condition where a voltage of 0.5V is applied onto the gate electrode 62 of the memory cell. According to FIG. 7, the gate threshold voltage in the example of a related art device (curve 'A') gets reduced for 0.6V by 100 applications of the disturb voltage. The gate threshold voltage in the line B gets reduced for about only 0.3V by 100 applications of the disturb voltage because of the 0.5V application. This result shows that application of a positive voltage onto a non-selected memory cell, at the time of a writing operation, brings a better resistant performance against the disturb voltage than the example of a related art device does. That is to say, since the first mis-erasing prevention voltage (for example, 2.5V in FIG. 5) is applied onto a non-selected memory cell at the time of writing operation in this exemplary embodiment, it brings a better resistant performance against the disturb voltage than the example of a related art device does.

Though increasing the number of memory cells in a block enables high-density integration, it also causes increased number of applications of the disturb voltage onto each memory cell. However, implementing this exemplary embodiment makes it possible to materialize an excellent resistant performance against the disturb voltage so that the number of memory cells in a block can be increased.

As an additional effect, access speed can also be enhanced. In the example of the related art device, the decrease of the gate threshold voltage due to the disturb voltage must be taken into account as a design margin at the stage of design work. In other words, it is needed to set a longer voltage application time in a writing operation for the purpose of preventing mis-reading. Then, by setting such a longer voltage application time, a margin can be secured against the decrease of the gate threshold voltage, but a problem of decreased access speed remains in the example of the related art device.

However, implementing this exemplary embodiment makes it possible to lessen the decrease of the gate threshold voltage of each memory cell so as to remove the extra writing time as the margin against the decrease of the gate threshold voltage. Specifically, the voltage application time in writing operation can be shortened and access speed can be enhanced.

5. Regarding First Mis-Erasing Prevention Voltage

Figure 8:
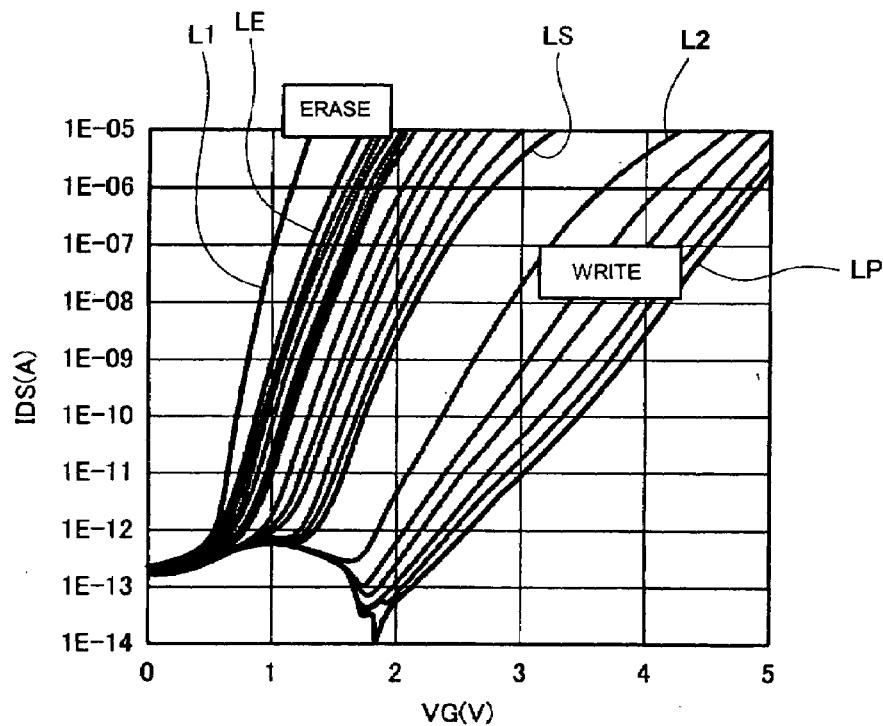
FIG. 8 is a graph to show relationship of the current IDS vs. the gate threshold voltage "VG"

Next, by referring to FIG. 8, values of the first mis-erasing prevention voltage are explained. FIG. 8 shows a group of curves obtained when, for a memory cell, a writing operation is done by degrees and then an erasing operation is subsequently done by degrees after having written sufficient electrons. Each curve is obtained by measuring the current IDS flowing between the first impurity region fd and the second impurity region sd in relation to the change of the application voltage VG applied onto the gate electrode 62 of a memory cell, in which writing operation or erasing operation is done for a unit time (approx. 1μ-second). The curve L1 is a VG/IDS curve in an initial condition where neither a writing operation nor an erasing operation is done at all. Specifically, in the condition, it is not known how many electrons are trapped in the nitride film 61.

Furthermore, from the condition of the curve L1, a writing operation (to apply 5V onto the first impurity region fd, 0V onto the second impurity region sd, and 7V onto the gate electrode 62) is done for a unit time (approx. 1μ-second). Then, the relationship between the gate electrode voltage VG and the current IDS is measured to obtain the curve L2. A series of these work steps is repeated several times so as to obtain the curve LP, which represents the condition where electrons have been written at most.

Afterwards, an erasing operation is done for the memory cell for a unit time (approx. 1μ-second) to measure the relationship between the gate electrode voltage VG and the current IDS. Furthermore, an erasing operation for a unit time (approx. 1μ-second) is done to measure the relationship between the gate electrode voltage VG and the current IDS. These work steps are repeated so as to obtain the curve LE, which represents the condition where electrons have been removed at most.

From the group of curves, it is understood that the amount of electrons to be written in a writing operation and the amount of electrons to be removed in an erasing operation can be controlled by adjusting the voltage application time. Furthermore, it is also understood that the gate threshold voltage can be set arbitrarily by adjusting the balance between the amount of electrons to be written and the amount of electrons to be removed.

The first mis-erasing prevention voltage is set with a positive voltage lower than the selection voltage to be supplied to the selected word line, for the purpose of preventing mis-writing into any non-selected memory cell in writing operation. Still further, it is also possible to set the first mis-erasing prevention voltage with a positive voltage lower than the gate threshold voltage of the memory cell in which a writing operation has been done. Moreover, it is also possible to set the first mis-erasing prevention voltage with a positive voltage lower than the gate threshold voltage of the memory cell in which erasing operation has been done. The first mis-erasing prevention voltage, set in the manner described above, can reduce the likelihood or prevent a decrease of the gate threshold voltage of any non-selected memory cell and any mis-erasing without making any mis-writing happen. If the relationship between the current IDS and the gate electrode voltage in a memory cell after an erasing operation is as the curve LS shows, it is also possible to set the first mis-erasing prevention voltage to be around 1V. Furthermore, if the first mis-erasing prevention voltage is set with a positive voltage lower than the gate threshold voltage of a memory cell in which electrons have been removed at most (for example, 0.5V), it becomes possible to reduce the likelihood or prevent a decrease of the gate threshold voltage of any non-selected memory cell and any mis-erasing without any chance of making mis-writing happen for each memory cell 60 of the memory cell array 40. In addition, the higher the first mis-erasing prevention voltage is, the more likely mis-erasing can be prevented. However, setting the first mis-erasing prevention voltage with an excessively high value causes mis-writing conversely.

In this exemplary embodiment, using the second mis-erasing prevention voltage makes it possible to set the first mis-erasing prevention voltage with a voltage higher than 0.5V (for example, 2.5V in FIG. 5). The second mis-erasing prevention voltage is described below.

6. Regarding Second Mis-Erasing Prevention Voltage

Figure 9:
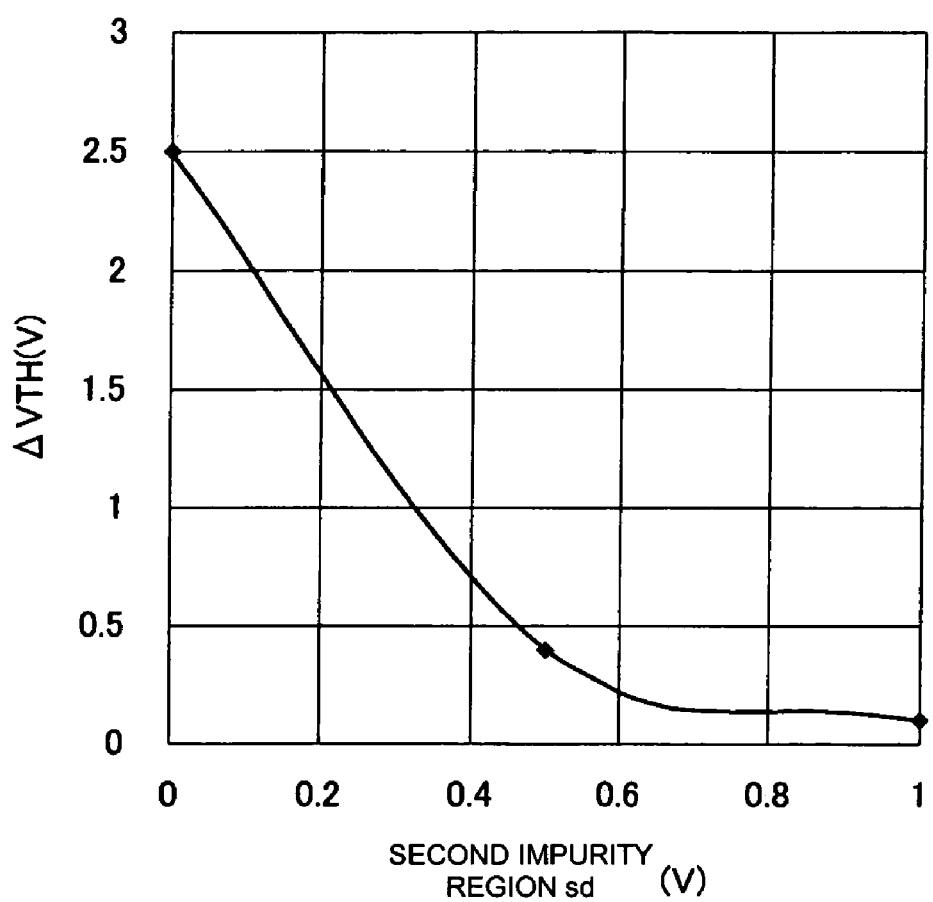
FIG. 9 is a graph to show relationship of an application voltage onto a second impurity region vs. a gate threshold voltage.

Next, values of the second mis-erasing prevention voltage are explained. FIG. 9 is a graph that shows the change in the gate threshold voltage before and after a writing operation under a condition where the voltage to be supplied to the second impurity region sd of a non-selected memory cell is increased by degrees. $\Delta$VTH indicates the difference between the gate threshold voltage of the non-selected memory cell after a writing operation and that before a writing operation (i.e., "the gate threshold voltage after a writing operation"-"the gate threshold voltage before a writing operation"). The objective memory cell of FIG. 9 is a non-selected memory cell in which almost no electron is trapped (a non-selected memory cell for which erasing operation has done).

According to FIG. 9, when the voltage supplied to the second impurity region sd of the non-selected memory cell is 0V, $\Delta$VTH is 2.5V. This value means that the gate threshold voltage of the non-selected memory cell has increased by 2.5V after a writing operation. In other words, $\Delta$VTH being 2.5V means that some electrons are trapped in the trap region tr of the non-selected memory cell, and it specifically implies that there is a chance of mis-writing into the non-selected memory cell.

When the voltage supplied to the second impurity region sd of the non-selected memory cell becomes 1V, $\Delta$VTH is approximately 0.1V. This value means that the gate threshold voltage of the non-selected memory cell has increased by 0.1V after a writing operation. In other words, $\Delta$VTH being 0.1V means that almost no electrons are trapped in the trap region tr of the non-selected memory cell, and it specifically implies that there is almost no chance of mis-writing into the non-selected memory cell.

If the second impurity region sd is supplied with some voltage, the gate threshold voltage of the non-selected memory cell increases. Under such condition, even though the first mis-erasing prevention voltage is applied onto the non-selected memory cell, almost no electrons are trapped in the trap region tr of the non-selected memory cell so that mis-erasing is not caused.

The reason why the gate threshold voltage increases when the second impurity region sd is supplied with some voltage is described below. If the voltage to be supplied to the second impurity region sd is increased, the potential difference between the substrate 63 and the second impurity region sd becomes greater so that the gate threshold voltage, which has taken a substrate bias into account, increases more than the gate threshold voltage with the second impurity region sd supplied with a voltage of 0V.

Moreover, since the voltage to be supplied to the second impurity region sd is increased so that the potential difference between the gate electrode 62 and the second impurity region sd becomes less, the amount of hot electrons generated in the channel region gets decreased.

That is to say; even if the first mis-erasing prevention voltage is set with a high value, mis-writing can be avoided by applying the second mis-erasing prevention voltage. The first mis-erasing prevention voltage set with a higher value enhances the resistant performance of the memory cell against the disturb voltage, and enables more effective mis-erasing prevention. Eventually, it enables more positive block-size enlargement (or high-density integration), and enhancement of access speed.

7. Modifications

Figure 10:
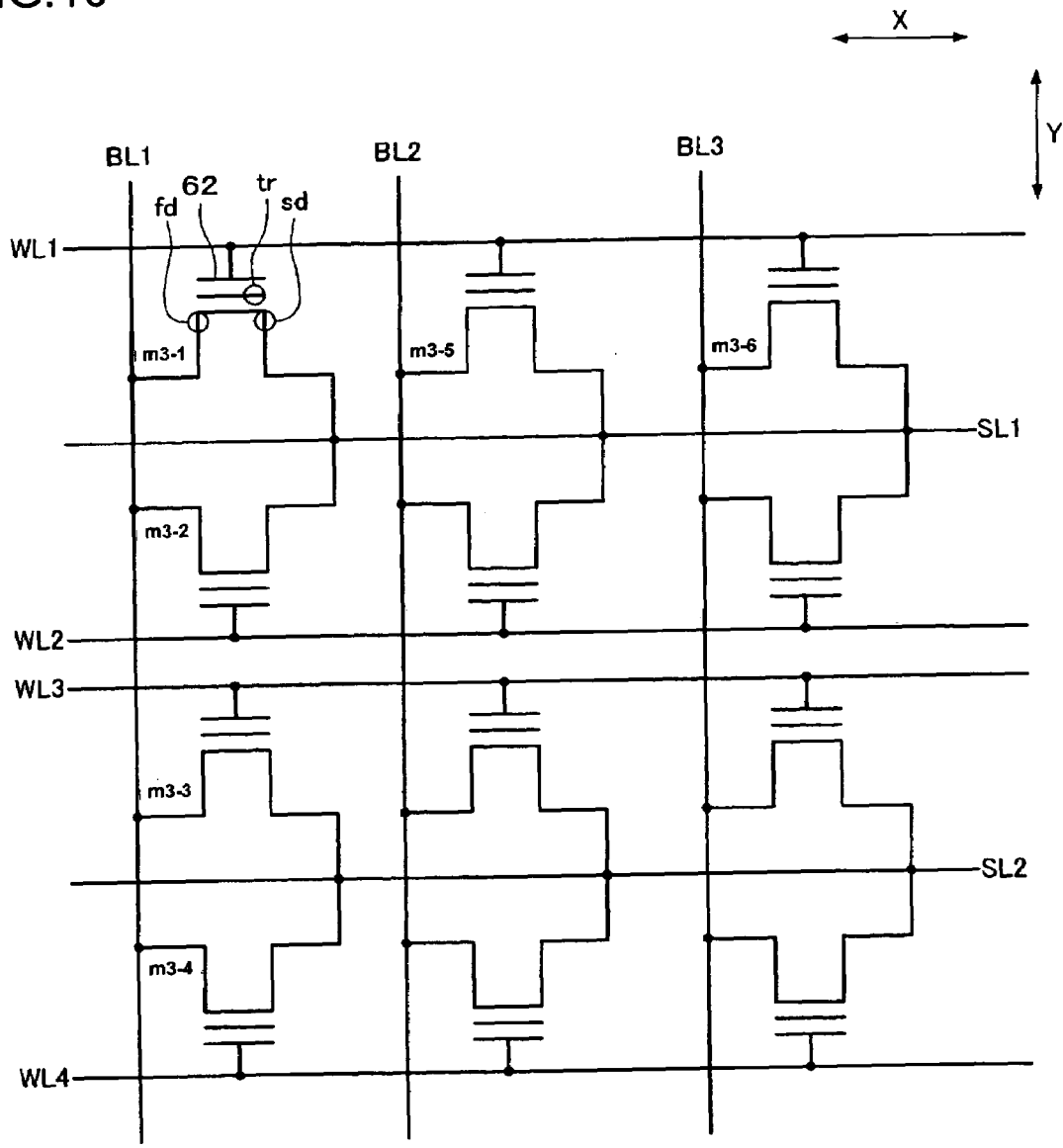
FIG. 10 is a schematic showing a modification relating to the presented exemplary embodiment.

FIG. 10 illustrates a schematic of a memory cell array of a modification of this exemplary embodiment. Each of the reference numerals, m3-1 through m3-4, represents the memory cell 60. Each of the word lines, WL1 through WL4, and the source lines, SL1 through SL2, is arranged along the row direction X. Each of the bit lines, BL1 through BL3, is arranged along the column direction Y. The second impurity region sd of each of a first group of memory cells 60 (for example; a plurality of memory cells 60 connected to the word line WL1), which are arranged along the row direction X, and the second impurity region sd of each of a second group of memory cells 60 (for example; a plurality of memory cells 60 connected to the word line WL2), which are adjacent to the first group of memory cells 60 and arranged along the row direction X, are connected to one source line 30 (for example, the source line SL1) in common. The gate electrode 62 of each of the memory cells 60 (for example; memory cells of m3-1, m3-5, and m3-6), which are arranged along the row direction X, is connected to the word line WL1 in common. The first impurity region fd of each of the memory cells 60 (for example; memory cells of m3-1 through m3-4), which are arranged along the column direction Y, is connected to the bit line BL1 in common. Between the gate electrode 62 and the substrate 63, the trap region tr is formed at the side of the second impurity region sd.

The case of writing into the memory cell m3-1 is described next. To select the memory cell m3-1, the word line WL1 is supplied with a selection voltage (for example, 11V). Meanwhile, the word line WL2 is supplied with a voltage that is lower than a first mis-erasing prevention voltage but higher than 0V (for example, 0.5V). The other word lines, WL3 through WL4, are each supplied with a first mis-erasing prevention voltage (for example, 2.5V). The bit line BL1 connected to the memory cell m3-1 is supplied with a writing selection voltage (for example, 0V). In addition, the source line SL1 connected to the memory cell m3-1 is supplied with a writing source voltage (for example, 5.5V). The source line SL2 is supplied with a second mis-erasing prevention voltage (for example, 1.8V). Furthermore, each of the bit lines, BL2 and BL3, is set with a non-selected bit line voltage (for example, 5.5V).

Under such voltage applying condition, a writing operation is done for the memory cell m3-1. Each of the memory cells, m3-2 through m3-4, is connected to the bit line BL1 as the memory cell m3-1 is. Therefore, the first impurity region fd of each of the memory cells, m3-2 through m3-4, is supplied with a writing selection voltage. However, the word line WL2 connected to the memory cell m3-2 is supplied with a voltage lower than the selection voltage (For example, 0.5V), and as a result, almost no electron tunneling is caused there. Furthermore, each of the word lines, WL3 through WL4, which are connected to the memory cells m3-3 through m3-4, respectively, is supplied with the first mis-erasing prevention voltage, and the source line SL2 is supplied with the second mis-erasing prevention voltage, so that almost no electron tunneling is caused there. No electron is written into each of the memory cells m3-2 through m3-4. Moreover, mis-erasing onto each of the memory cells, m3-2 through m3-4, can be prevented by the first mis-erasing prevention voltage and the second mis-erasing prevention voltage, and it is possible to control any disturb voltage that removes the electron(s) from the trap region tr of each of the memory cells m3-2 through m3-4.

8. DETAILED EXAMPLE

Figure 11:
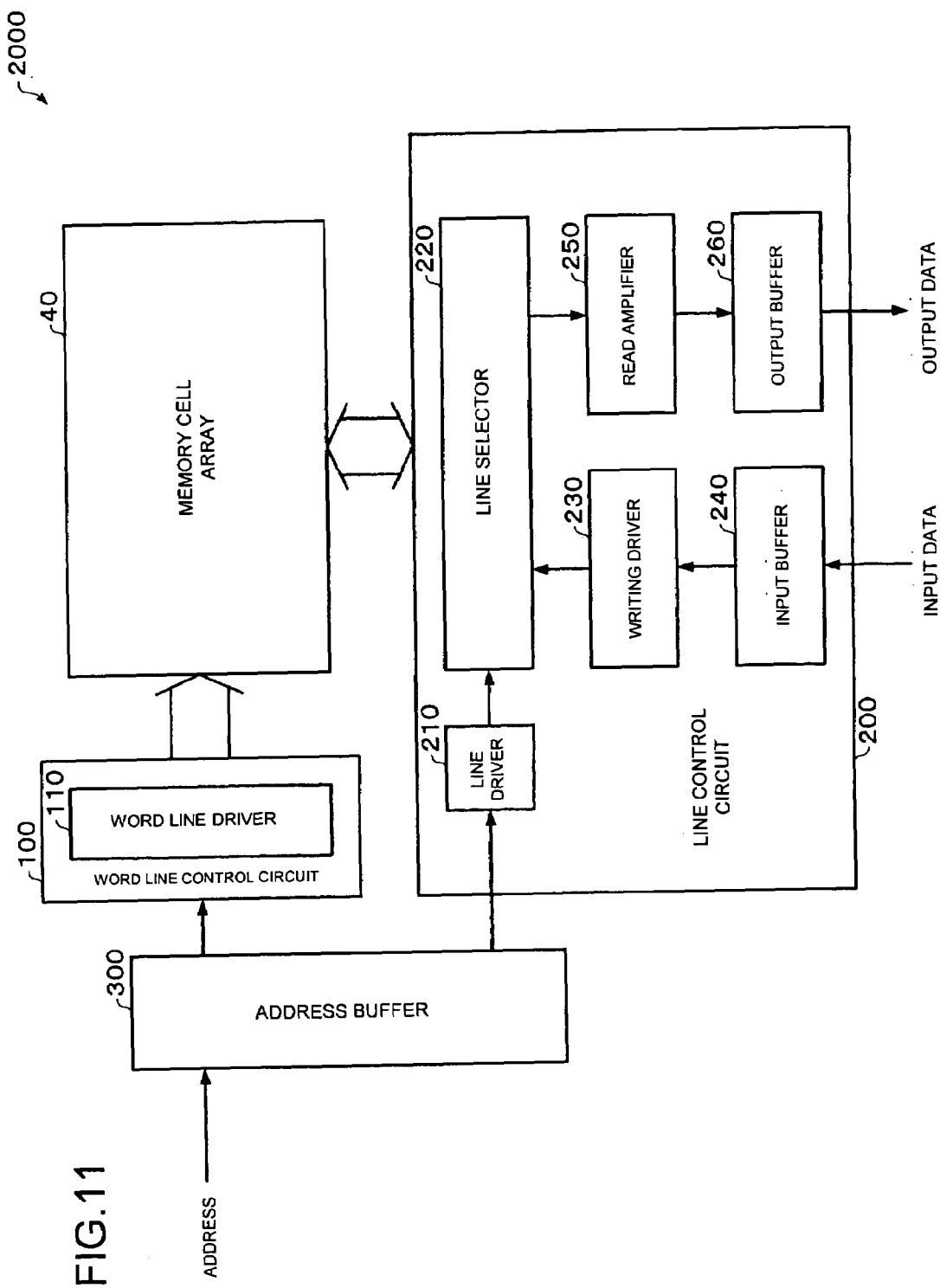
FIG. 11 is a schematic showing a detailed example relating to the presented exemplary embodiment.

FIG. 11 shows a schematic that relates to this exemplary embodiment. A reference numeral 2000 represents a nonvolatile memory device. A reference numeral 110 indicates a word line driver, and a reference numeral 210 represents a line driver. A reference numeral 220 indicates a line selector and a reference numeral 230 represents a writing driver. A reference numeral 240 represents an input buffer and a reference numeral 250 indicates a read amplifier. A reference numeral 260 represents an output buffer and a reference numeral 300 indicates an address buffer.

The word line control circuit 100 includes the word line driver 110. Also, the line control circuit 200 includes the line driver 210, the line selector 220, the writing driver 230, the input buffer 240, the read amplifier 250, and the output buffer 260. This construction shows just an example, and any or all of the line driver 210, the line selector 220, the writing driver 230, the input buffer 240, the read amplifier 250, and the output buffer 260 may be installed outside the line control circuit 200.

Writing Operation

At the time of writing operation, address information and input data are supplied to the nonvolatile memory device 2000 externally. The supplied address information is buffered into the address buffer 300. Then the buffered address information is supplied to the word line control circuit 100 and the line control circuit 200. Also the supplied input data is buffered into the input buffer 240 in the line control circuit 200. Then the buffered input data is supplied to the writing driver 230.

The word line control circuit 100 controls the word line driver 110 according to the supplied address information. The word line driver 110 chooses a word line to be selected among the word lines arranged in the memory cell array 40, and supplies the selected word line with a selection voltage (for example, 11V). Any other word line is supplied with the first mis-erasing prevention voltage (for example, 2.5V).

Meanwhile, the line selector 220 supplies each required voltage to a relevant bit line and a relevant source line among the bit lines and source lines arranged in the memory cell array 40. At this time, the line selector 220 supplies a selected bit line voltage (for example, 5.5V) to the relevant bit line, and supplies a selected source voltage (for example, 0V) to the relevant source line. Any other source line is supplied with a second mis-erasing prevention voltage (for example, 1.8V). Any other bit line is set with a grounding potential. As another treatment method, any other bit line may be set into a floating condition as well. By having such a voltage applying condition, it becomes possible to carry out a writing operation onto a selected memory cell while effectively reducing the likelihood or preventing mis-erasing operations from happening onto any non-selected memory cell.

Erasing Operation

An erasing operation is carried out so as to erase the contents of a block collectively as a unit. The word line control circuit 100 supplies an erasing selection voltage (for example, 0V) to a word line inside a block. The line control circuit supplies an erasing voltage (for example, 8V) to a bit line inside the block. Each source line 30 in the block is set with a grounding potential. As another treatment method, each source line 30 may be set into floating condition as well. By having such a voltage applying condition, it becomes possible to carry out erasing operation.

Reading Operation

At the time of a reading operation, address information is supplied to the nonvolatile memory device 2000 externally. In the same manner as a writing operation, the address information is supplied to the word line control circuit 100 and the line control circuit 200. The word line control circuit 100 controls the word line driver 110 according to the supplied address information. The word line driver 110 chooses a word line as required among the word lines arranged in the memory cell array 40, and supplies the word line with a reading selection voltage (for example, 3V). The word line driver 110 supplies each of the other word lines with a non-selection voltage (for example, 0V). Each of the other word lines may also be set with a grounding potential or into floating condition.

The line selector 220 supplies a reading voltage (for example, 2V) to a relevant bit line 20 among the bit lines 20 arranged in the memory cell array 40. Each source line 30 and the other bit lines 20 are set with a grounding potential. As another treatment method, each source line 30 and the other bit lines 20 may be set into floating condition as well. By having such voltage applying conditions, it becomes possible to carry out reading operation.

What is claimed is:

1. A nonvolatile semiconductor memory device, comprising:
    a memory cell array equipped with a plurality of memory cells arranged in a matrix, a plurality of word lines, a plurality of bit lines, and a plurality of source lines;
    a word line control circuit to control the plurality of word lines; and
    a line control circuit to control the plurality of bit lines and the plurality of source lines;
    each of the plurality of memory cells including a gate electrode connected to a word line, a first impurity region connected to a bit line, a second impurity region connected to a source line, and an electron trap region, which is positioned between the gate electrode and a substrate, and is formed at least at a first impurity region side of both the first impurity region and second impurity region;

at a time when a writing operation is performed for a selected memory cell, the word line control circuit providing a selected word line connected to the selected memory cell with a selection voltage, and the word line control circuit providing a non-selected word line connected to a non-selected memory cell that is connected in common to a bit line connected to the selected memory cell with a first mis-erasing prevention voltage; and at a time when a writing operation is performed for a selected memory cell, the line control circuit providing a bit line connected to the selected memory cell with a program voltage, the line control circuit providing a source line connected to the selected memory cell with a source voltage for a program, the line control circuit providing a bit line connected to the non-selected memory cell that is connected in common to a bit line connected to the selected memory cell with a program voltage, and the line control circuit providing a source line connected to the non-selected memory cell with a second mis-erasing prevention voltage.

2. The nonvolatile semiconductor memory device according to claim 1, the word line control circuit providing a positive voltage lower than the selection voltage as the first mis-erasing prevention voltage.

3. The nonvolatile semiconductor memory device according to claim 1, the line control circuit providing a positive voltage lower than the selection voltage as the second mis-erasing prevention voltage.

4. The nonvolatile semiconductor memory device according to claim 1, the word line control circuit providing a voltage lower than a gate threshold voltage of a memory cell, for which a writing operation is done, as the first mis-erasing prevention voltage.

5. The nonvolatile semiconductor memory device according to claim 1, the word line control circuit providing a voltage lower than a gate threshold voltage of a memory cell, for which an erasing operation is done, as the first mis-erasing prevention voltage.

6. The nonvolatile semiconductor memory device according to claim 1, the electron trap region being formed at a nitride film placed between a first oxide film and a second oxide film.

7. The nonvolatile semiconductor memory device according to claim 1, the electron trap region being formed at a silicon dot region placed between a first oxide film and a second oxide film.

8. The nonvolatile semiconductor memory device according to claim 1, the word line control circuit providing a word line connected to the selected memory cell with an erasing voltage lower than the first mis-erasing prevention voltage, at the time when an erasing operation is done for the selected memory cell.

9. The nonvolatile semiconductor memory device according to claim 1;

the plurality of word lines and the plurality of source lines being arranged along a row direction;

the plurality of bit lines being arranged along a column direction;

the second impurity region of each memory cell of at least one row arranged in a row direction being connected to at least one source line in common;

the gate electrode of each memory cell of at least one row arranged in the row direction being connected to at least one word line in common; and the first impurity region of each memory cell of at least one column arranged in a column direction being connected to at least one bit line in common.

10. The nonvolatile semiconductor memory device according to claim 9, the electron trap region being formed at the first impurity region side, while being positioned between the gate electrode and a substrate.

11. The nonvolatile semiconductor memory device according to claim 9, the second impurity region of the memory cell of one row arranged in the row direction, and a second impurity region of a memory cell of another row that is arranged in the row direction while being adjacent to the memory cell of one row, being connected to at least one of the source lines in common.

12. The nonvolatile semiconductor memory device according to claim 11, the electron trap region being formed at the second impurity region side, while being positioned between the gate electrode and a substrate.

13. A method of controlling a nonvolatile semiconductor memory device that includes a memory cell array equipped with a plurality of memory cells arranged in a matrix, a plurality of word lines, a plurality of bit lines, and a plurality of source lines, each of the plurality of memory cells equipped with a gate electrode connected to a word line, a first impurity region connected to a bit line, a second impurity region connected to a source line, and an electron trap region, which is positioned between the gate electrode and a substrate, and is formed at least at the first impurity region side of both the first impurity region and second impurity region, in a writing operation done for a selected memory cell; the method of comprising:

providing a selection voltage to the gate electrode of the selected memory cell;

providing a first mis-erasing prevention voltage to the gate electrode of a non-selected memory cell connected in common to a selected bit line connected to the selected memory cell;

providing a program voltage to the first impurity region of the selected memory cell;

providing a source voltage for a program to the second impurity region of the selected memory cell;

providing a program voltage to the first impurity region of the non-selected memory cell connected to the selected bit line in common with; and providing a second mis-erasing prevention voltage to the second impurity region of the non-selected memory cell.

14. The control method according to claim 13, further including providing a positive voltage lower than a selection voltage as the first mis-erasing prevention voltage.

15. The control method according to claim 13, further including providing a positive voltage lower than a selection voltage as the second mis-erasing prevention voltage.

16. The control method according to claim 13, further including providing a voltage lower than a gate threshold voltage of a memory cell, for which a writing operation is performed, being provided as the first mis-erasing prevention voltage.

17. The control method according to claim 13, further including providing a voltage lower than a gate threshold voltage of a memory cell, for which an erasing operation is performed, as the first mis-erasing prevention voltage.

18. The control method according to claim 13, further including providing at the time when an erasing operation is performed for the selected memory cell, an erasing voltage for the gate electrode of the selected memory cell.

* * * * *